US009520530B2

(12) United States Patent
Wu

(10) Patent No.: US 9,520,530 B2
(45) Date of Patent: Dec. 13, 2016

(54) SOLAR CELL HAVING DOPED BUFFER LAYER AND METHOD OF FABRICATING THE SOLAR CELL

(71) Applicant: TSMC Solar Ltd., Taichung (TW)

(72) Inventor: Jyh-Lih Wu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/505,534

(22) Filed: Oct. 3, 2014

(65) Prior Publication Data
US 2016/0099375 A1  Apr. 7, 2016

(51) Int. Cl.
H01L 31/18 (2006.01)
H01L 31/0224 (2006.01)
H01L 31/032 (2006.01)
H01L 31/0336 (2006.01)

(52) U.S. Cl.
CPC ... *H01L 31/1864* (2013.01); *H01L 31/022441* (2013.01); *H01L 31/022466* (2013.01); *H01L 31/0322* (2013.01); *H01L 31/0324* (2013.01); *H01L 31/0336* (2013.01); *H01L 31/03365* (2013.01); *H01L 31/18* (2013.01); *H01L 31/1832* (2013.01); *H01L 31/1884* (2013.01)

(58) Field of Classification Search
CPC .............. H01L 31/18; H01L 31/224; H01L 31/022466; H01L 31/1884; H01L 31/0352; H01L 31/1864; H01L 31/1832; H01L 31/022441; H01L 31/0322; H01L 31/03365; H01L 31/0324; H01L 31/0336
See application file for complete search history.

(56) References Cited

U.S. PATENT DOCUMENTS

| | | | |
|---|---|---|---|
| 2009/0087940 A1* | 4/2009 | Kushiya | 438/94 |
| 2010/0267190 A1* | 10/2010 | Hakuma | H01L 31/0296 438/95 |
| 2010/0330734 A1* | 12/2010 | Matsumoto et al. | 438/93 |
| 2011/0005591 A1* | 1/2011 | Buller et al. | 136/256 |
| 2011/0018089 A1* | 1/2011 | Hakuma et al. | 257/463 |
| 2011/0146785 A1* | 6/2011 | Buller et al. | 136/256 |
| 2011/0227131 A1* | 9/2011 | Zhao et al. | 257/184 |
| 2011/0259395 A1* | 10/2011 | Wieting et al. | 136/246 |
| 2011/0277812 A1* | 11/2011 | Buller et al. | 136/244 |

(Continued)

FOREIGN PATENT DOCUMENTS

| | | |
|---|---|---|
| CN | 101978507 B | 11/2012 |
| TW | 201203576 A | 1/2012 |

(Continued)

OTHER PUBLICATIONS

Von Roedern, B. et al., "Material Requirements for Buffer Layers Used to Obtain Solar Cells with High Open Circuit Voltages", Conference Paper—National Renewable Energy Laboratory NREL/CP-520-26363, Apr. 1999, 9 pages.

(Continued)

*Primary Examiner* — Fazli Erdem
(74) *Attorney, Agent, or Firm* — Duane Morris LLP; Steven E. Koffs

(57) ABSTRACT

A method includes: forming a buffer layer over an absorber layer of a photovoltaic device; and extrinsically doping the buffer layer after the forming step.

19 Claims, 6 Drawing Sheets

(56) References Cited

U.S. PATENT DOCUMENTS

| | | | |
|---|---|---|---|
| 2012/0067414 A1* | 3/2012 | Lee et al. | 136/256 |
| 2012/0247553 A1* | 10/2012 | Burrows et al. | 136/256 |
| 2013/0167916 A1 | 7/2013 | Lee et al. | |
| 2014/0127853 A1* | 5/2014 | Chen et al. | 438/98 |
| 2014/0134784 A1* | 5/2014 | Lin et al. | 438/95 |
| 2014/0217408 A1* | 8/2014 | Hong et al. | 257/53 |
| 2014/0261657 A1* | 9/2014 | Cheng et al. | 136/256 |
| 2014/0366935 A1* | 12/2014 | Chiang et al. | 136/256 |
| 2015/0004734 A1* | 1/2015 | Chen | 438/57 |
| 2015/0007890 A1* | 1/2015 | Xu et al. | 136/260 |
| 2015/0079717 A1* | 3/2015 | Yen et al. | 438/57 |
| 2015/0114458 A1* | 4/2015 | Cheng | H01L 31/022441 136/256 |
| 2015/0263195 A1* | 9/2015 | Huang | H01L 31/18 136/256 |
| 2015/0280051 A1* | 10/2015 | Xu | H01L 31/1884 438/98 |

FOREIGN PATENT DOCUMENTS

| | | |
|---|---|---|
| TW | 201327876 A | 7/2013 |
| TW | 201427054 A | 7/2014 |
| TW | 201436264 A | 9/2014 |
| WO | 2009119161 A2 | 10/2009 |

OTHER PUBLICATIONS

Official Action issued Jun. 20, 2016 in counterpart Taiwan patent application.

* cited by examiner

Depth from the interface between Buffer and TCO

SOLAR CELL HAVING DOPED BUFFER LAYER AND METHOD OF FABRICATING THE SOLAR CELL

BACKGROUND

This disclosure related to fabrication of thin film photovoltaic cells. Solar cells are electrical devices for generation of electrical current from sunlight by the photovoltaic (PV) effect. Thin film solar cells have one or more layers of thin films of PV materials deposited on a substrate. The film thickness of the PV materials can be on the order of nanometers or micrometers.

Absorber layers absorb light for conversion into electrical current. Examples of thin film PV materials used as absorber layers in solar cells include copper indium gallium selenide (CIGS) and cadmium telluride. Solar cells also include front and back contact layers to assist in light trapping and photo-current extraction and to provide electrical contacts for the solar cell. The front contact typically comprises a transparent conductive oxide (TCO) layer. The TCO layer transmits light through to the absorber layer and conducts current in the plane of the TCO layer. Some solar cells include a buffer layer between the absorber layer and the TCO layer. The buffer layer can increase cell efficiency, increase open circuit voltage (Voc), short circuit current (Jsc) and fill factor (FF), compared to a similar solar cell without a buffer layer.

Suitable buffer layers, such as CdS and ZnS, have been used in high efficiency CIGS solar cells. The buffer layers function as n-type materials to form a p/n junction with p-type CIGS or CdTe. Typically, CdS and ZnS-based buffer layers are prepared using chemical bath deposition (CBD) due to its low cost, simple processing and scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Unless indicated otherwise, like reference numerals in two or more drawings refer to like items.

DETAILED DESCRIPTION

Figure 1:
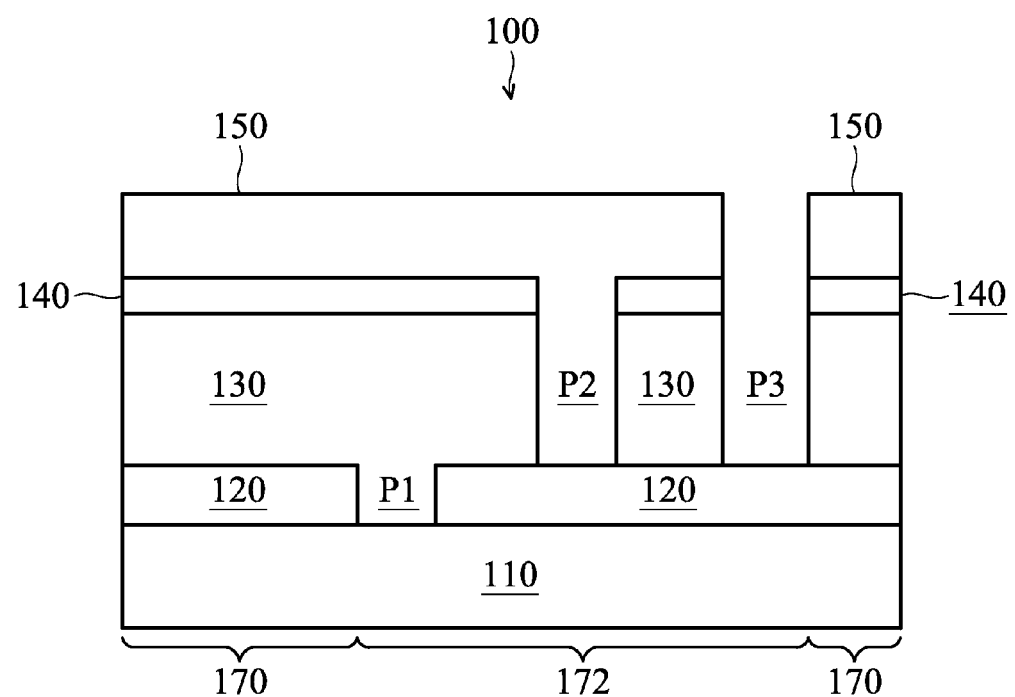
FIG. 1 is a cross-sectional view of a solar cell, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a photovoltaic cell, the photo-generated electron-hole pair is dissociated within the depletion region where a built-in potential is formed by the p/n junction. In order to widen the depletion region and thus improve the junction quality, increased carrier concentration of the buffer layer is desired. To achieve this goal, the buffer layer can be modified by extrinsic doping (e.g., doping with boron). The modified buffer layer can offer a more favorable substrate surface for TCO formation, thus enhancing the adhesion between the buffer layer and the TCO layer.

If the buffer layer is deposited by CBD, the carrier concentration of the buffer layer can be altered by varying the processing condition of CBD, such as bath temperature, or ion ratio. Dosing dopant sources into the solution can increase the carrier concentration of the buffer layer. In other embodiments described herein, extrinsic doping of the buffer layer can be extended to non-CBD processed buffer layers. For example, the methods described below can be used to extrinsically dope buffer layers deposited by processes such as atomic layer deposition (ALD), sputtering, electro-deposition, evaporation and chemical vapor deposition (CVD).

This disclosure describes solar cells and methods of fabricating the solar cells, in which a buffer layer is first formed by any suitable method, and then the buffer layer is extrinsically doped. In some embodiments, the extrinsic doping is performed by annealing the buffer layer in a selected atmosphere in the same metal organic chemical vapor deposition (MOCVD) tool in which the front contact transparent conductive oxide (TCO) material is deposited. Thus, the buffer layer can be extrinsically doped regardless of whether the buffer layer is formed by CBD, ALD, sputtering, electro-deposition, evaporation, or CVD.

FIG. 1 shows a solar panel 100 as it is configured after front contact formation, in accordance with some embodiments. The portion of the solar panel 100 shown in FIG. 1 includes an interconnect structure 172, which provides a series connection between two adjacent solar cells of the panel 100. In FIG. 1, the width of the interconnect structure 172 is exaggerated relative to the width of the collection region 170 for clarity, but the collection region 170 is actually much wider than the interconnect structure 172.

The solar cell 100 includes a solar cell substrate 110, a back contact layer 120, an absorber layer 130, a buffer layer 140 and a front contact layer 150.

Substrate 110 can include any suitable substrate material, such as glass. In some embodiments, substrate 110 includes a glass substrate, such as soda lime glass, or a flexible metal foil, or a polymer (e.g., a polyimide, polyethylene terephthalate (PET), polyethylene naphthalene (PEN)). Other embodiments include still other substrate materials.

Back contact layer 120 includes any suitable back contact material, such as metal. In some embodiments, back contact layer 120 can include molybdenum (Mo), platinum (Pt), gold (Au), silver (Ag), nickel (Ni), or copper (Cu). Other embodiments include still other back contact materials. In some embodiments, the back contact layer 120 is from about 50 nm to about 2 μm thick.

In some embodiments, absorber layer 130 includes any suitable absorber material, such as a p-type semiconductor. In some embodiments, the absorber layer 130 can include a chalcopyrite-based material comprising, for example, Cu(In,Ga)Se$_2$ (CIGS), cadmium telluride (CdTe), CuInSe$_2$ (CIS), CuGaSe$_2$ (CGS), Cu(In,Ga)Se$_2$ (CIGS), Cu(In,Ga)(Se,S)$_2$ (CIGSS), CdTe or amorphous silicon. Other embodiments include still other absorber materials. In some embodiments, the absorber layer 140 is from about 0.3 μm to about 8 μm thick.

The buffer layer 140 is deposited on the absorber 130 to form a p/n junction. The buffer layer 140 can include any suitable buffer material, such as n-type semiconductors. In some embodiments, buffer layer 140 can include cadmium sulphide (CdS), zinc sulphide (ZnS), zinc selenide (ZnSe), indium sulfide (In$_2$S$_3$), indium selenide (In$_2$Se$_3$), Zn$_{1-x}$Mg$_x$O, (e.g., ZnO), or in combination. Other embodiments include still other buffer materials. In some embodiments, the buffer layer 140 is from about 1 nm to about 500 nm thick.

Figure 6:
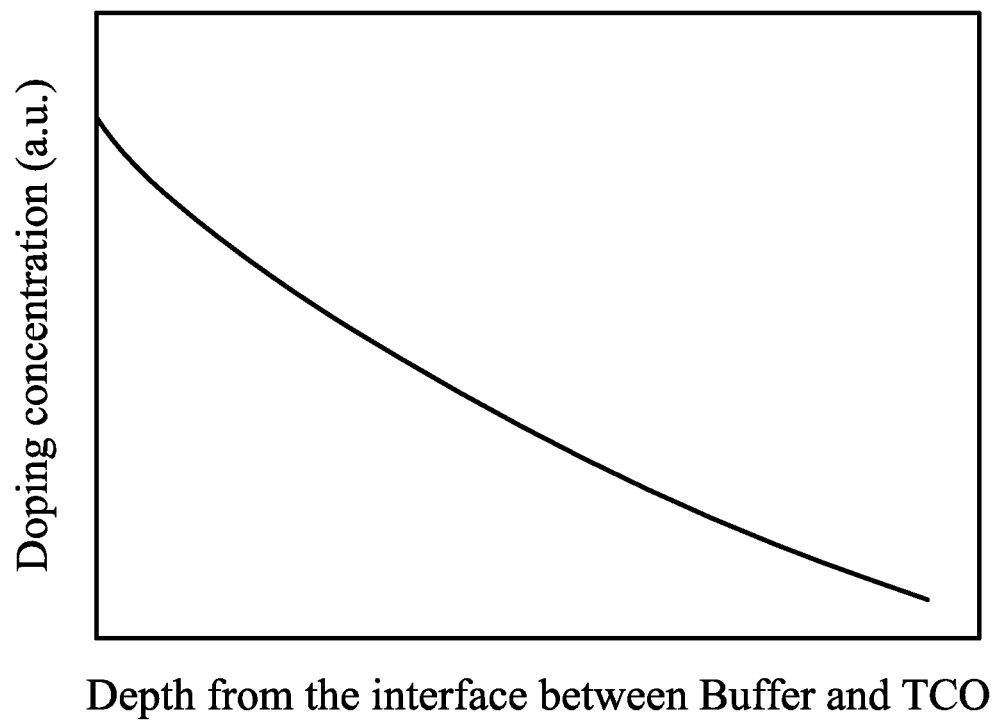
FIG. 6 is a diagram of an example of a doping concentration profile for a modified buffer layer.

In some embodiments, the buffer layer 140 is extrinsically doped in a process described below. In some embodiments, the dopant is boron. In some embodiments, the dopant distribution within the buffer layer is controlled to be position dependent. For example, the dopant concentration can be varied between the top surface of the buffer layer (interface between the TCO and the buffer layer) and the bottom surface (interface between the buffer layer and the absorber layer). FIG. 6 is a diagram of an example of a doping concentration profile for a modified buffer layer 140 as described herein. The dopant concentration is highest at the interface between the buffer layer 140 and the front contact layer 150. The concentration falls off most quickly near the interface between the buffer layer 140 and the front contact layer 150. The rate of change of the dopant concentration is smaller further away from the interface between the buffer layer 140 and the front contact layer 150.

In some embodiments, front contact layer 150 includes an annealed transparent conductive oxide (TCO) layer of constant thickness of about 100 nm or greater. The terms "front contact" and "TCO layer" are used interchangeably herein; the former term referring to the function of the layer 150, and the latter term referring to its composition. In some embodiments, the charge carrier density of the TCO layer 150 can be from about $1\times10^{17}$ cm$^{-3}$ to about $1\times10^{21}$ cm$^{-3}$. The TCO material for the annealed TCO layer can include suitable front contact materials, such as metal oxides and metal oxide precursors. In some embodiments, the TCO material can include AZO, GZO, AGZO, BZO or the like) AZO: alumina doped ZnO; GZO: gallium doped ZnO; AGZO: alumina and gallium co-doped ZnO; BZO: boron doped ZnO. In other embodiments, the TCO material can be cadmium oxide (CdO), indium oxide (In$_2$O$_3$), tin dioxide (SnO$_2$), tantalum pentoxide (Ta$_2$O$_5$), gallium indium oxide (GaInO$_3$), (CdSb$_2$O$_3$), or indium oxide (ITO). The TCO material can also be doped with a suitable dopant.

In some embodiments, in the doped TCO layer 150, SnO$_2$ can be doped with antimony, (Sb), flourine (F), arsenic (As), niobium (Nb) or tantalum (Ta). In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, SnO$_2$ can be doped with antimony (Sb), F, As, niobium (Nb), or tantalum (Ta). In other embodiments, In$_2$O$_3$ can be doped with tin (Sn), Mo, Ta, tungsten (W), Zr, F, Ge, Nb, Hf, or Mg. In other embodiments, CdO can be doped with In or Sn. In other embodiments, GaInO$_3$ can be doped with Sn or Ge. In other embodiments, CdSb$_2$O$_3$ can be doped with Y. In other embodiments, ITO can be doped with Sn. Other embodiments include still other TCO materials and corresponding dopants.

In some embodiments, a plurality of solar cells 100 are arranged adjacent to each other, with the front contact 150 of each solar cell conducting current to the next adjacent solar cell. Each solar cell 100 includes an interconnect structure 172 for conveying charge carriers from the front contact 150 of a solar cell to the back contact 120 of the next adjacent solar cell on the same panel. The layers 120, 130, 140 and 150 are provided in the collection regions 170. The interconnect structure 172 also includes three lines, referred to as P1, P2, and P3. The P1 scribe line extends through the back contact layer 130 and is filled with the absorber layer material. The P2 scribe line extends through the buffer layer 140 and the absorber layer 130, and contacts the back contact 120 of the next adjacent solar cell, thus connecting adjacent solar cells in series. The P3 line extends through the front contact layer 150, buffer layer 140 and absorber layer 130. The P3 line of the adjacent solar cell is immediately to the left of the collection region 170 of the solar cell 100.

The P3 line separates the front contacts 150, buffer layers 140 and absorber layers 130 of adjacent solar cells, so that each front contact can transmit current through the P2 scribe line to the back contact of the next adjacent solar cell without shorting between front adjacent contacts.

Figure 2:
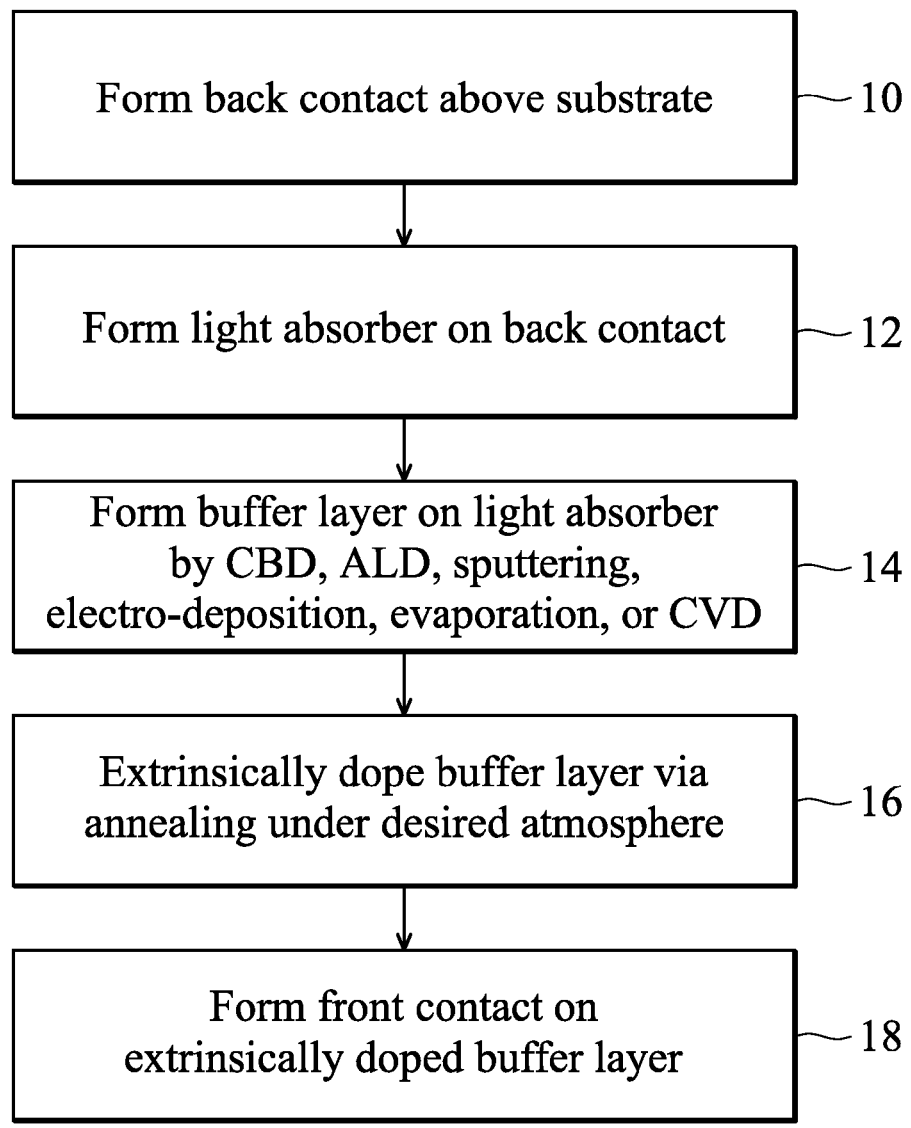
FIG. 2 is a flow chart of a method of fabricating a solar cell as shown in FIG. 1, in accordance with some embodiments.

FIG. 2 is a flow chart of a method of making the solar cell according to some embodiments.

At step 10, the back contact 120 is formed over the solar cell substrate 110. The back contact can deposited by PVD, for example sputtering, of a metal such as Mo, Cu or Ni over the substrate, or by CVD or ALD or other suitable techniques. Then the P1 scribe line is formed through the back contact layer 120. For example, the scribe line can be formed by mechanical scribing, or by a laser or other suitable scribing process. Each solar cell in the panel 100 has a respective P1 scribe line.

At step 12, an absorber layer 130 is formed over the back contact layer 120. The absorber layer 130 can be deposited by PVD (e.g., sputtering), CVD, ALD, electro deposition or other suitable techniques. For example, a CIGS absorber layer can be formed by sputtering a metal film comprising copper, indium and gallium then applying a selenization process to the metal film.

At step 14, the buffer layer 140 is formed over the absorber layer 130 by any suitable method. For example, the buffer layer 140 can be deposited by chemical deposition (e.g., chemical bath deposition, or CBD), PVD, ALD, sputtering, evaporation CVD or other suitable techniques. Following the buffer layer formation, the P2 scribe line is formed, extending completely through the buffer layer 140 and absorber layer 130.

At step 16, the buffer layer 140 is extrinsically doped after the buffer layer forming step 14. In some embodiments, the step 16 of extrinsically doping the buffer layer 140 includes annealing the buffer layer in an atmosphere comprising a dopant. In some embodiments, the atmosphere comprises at least one of the group consisting of boron (B), aluminum (Al), gallium (Ga), indium (In), or combinations thereof. In some embodiments, the atmosphere comprises $B_2H_6$.

In some embodiments, the annealing is performed at a temperature in a range from about 70° C. to about 400° C. For example, in some embodiments, the annealing temperature can be 68° C. or 72° C., or 395° C. or 405° C. In some embodiments, the annealing temperature can be about 170° C. For example, the temperature can be 167° C. or 173° C.

In some embodiments, the buffer layer is formed of CdS (or ZnS), the atmosphere comprises $B_2H_6$, and the annealing temperature and time are selected to achieve a dopant concentration ratio of dopant/Cd (or dopant/Zn) is in a range of $10^{-3}$ to $9 \times 10^{-1}$. The charge carrier concentration of undoped CdS is about $10^{16}$/cc. The concentration of doped CdS can range from about $10^{17}$/cc to $10^{18}$/cc. In some embodiments, at a temperature of about 170° C., a target doping concentration is achieved in about 10 minutes. For example, in some embodiments, the annealing time is 9 minutes or 11 minutes. In some embodiments, this dopant concentration can provide an increase in the energy of the optical bandgap of 0.05 eV. In other embodiments, lower annealing temperatures are used with longer annealing times.

In some embodiments, step 16 is performed in a chamber suitable for an MOCVD process.

At step 18, the front contact layer 150 is formed over the buffer layer 140, which is over the absorber layer 130. This step includes depositing a front contact material (TCO) over the buffer layer 140. In some embodiments, step 16 of extrinsically doping the buffer layer 140 and step 18 of forming the front contact layer 150 are both performed in the same tool. In some embodiments, the step 18 of depositing the front contact material comprises chemical vapor deposition (CVD), such as metal organic chemical vapor deposition (MOCVD). In other embodiments, the front contact material is deposited by low pressure chemical vapor deposition (LPCVD) or by plasma enhanced chemical vapor deposition (PECVD).

In some embodiments, steps 16 and 18 are both performed in the same chamber of a single processing tool. In other embodiments, steps 16 and 18 are performed in two different chambers within the same tool, and a robotic device moves the substrate 110 between the first chamber (where annealing is performed) and the second chamber (where the TCO material is deposited, without breaking the vacuum in the tool between steps 16 and 18.

In some embodiments, the front contact 150 allows at least 50% incident photons to be transmitted through the front contact 150.

Figure 3:
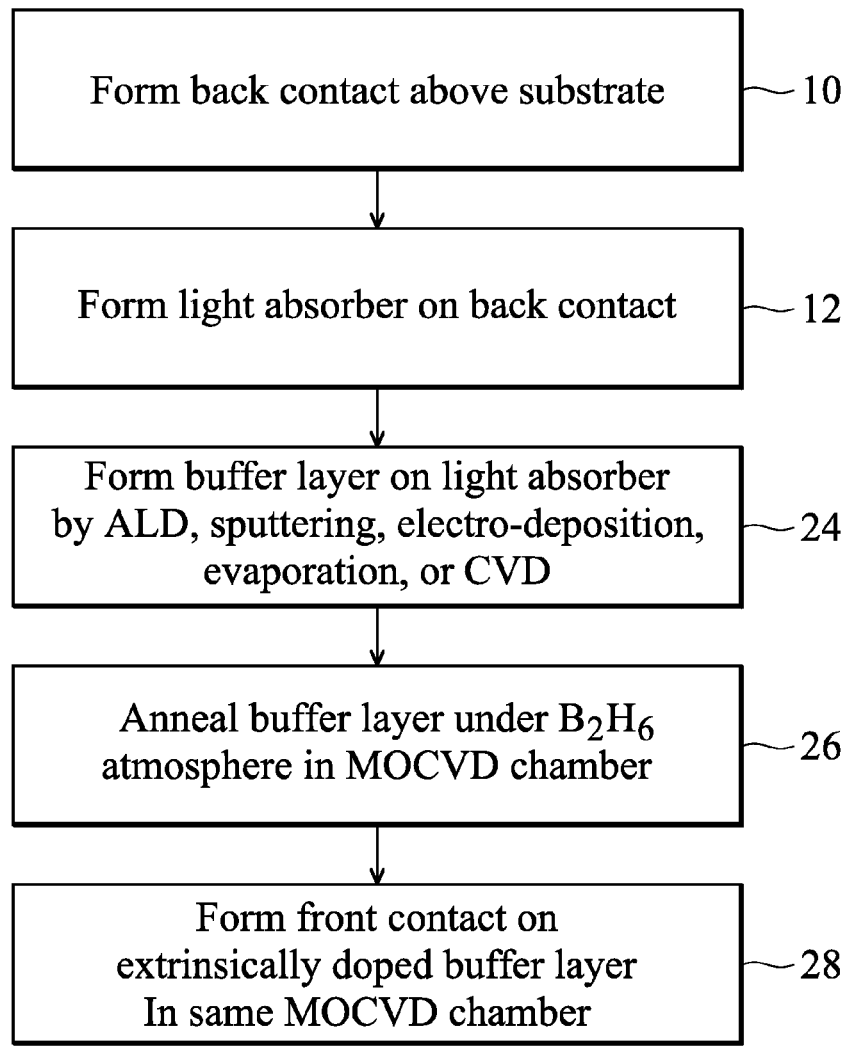
FIG. 3 is a flow chart of an example of the method of FIG. 2, in accordance with some embodiments.

FIG. 3 is a flow chart of an example of the method of FIG. 2 according to some embodiments.

Steps 10 and 12 of FIG. 3 can be the same as steps 10 and 12 of FIG. 2, and for brevity, descriptions thereof are not repeated.

At step 24, according to some embodiments, the buffer layer 140 is formed by a non-CBD method, such as ALD, sputtering, electro-deposition, evaporation or CVD. Because the methods described herein include a separate, non-CBD step for doping, the methods described herein can, but are not required to, include formation of the buffer layer by CBD.

At step 26, the buffer layer 140 is extrinsically doped by annealing within an MOCVD chamber in an atmosphere of $B_2H_6$. In some embodiments, the annealing is performed at a temperature of about 170° C. for about 10 minutes.

At step 28, the front contact 150 is formed on the extrinsically doped buffer layer by MOCVD in the same chamber in which the annealing is performed.

Figure 4:
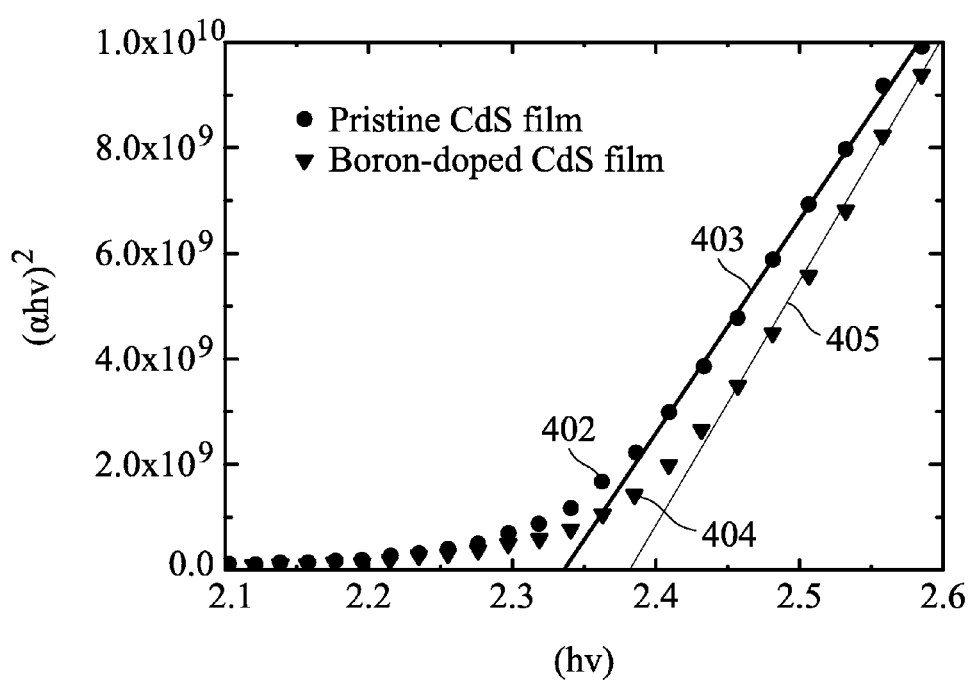
FIG. 4 is a Tauc plot of data characterizing the optical properties of an undoped buffer layer and a doped buffer layer as described herein.

FIG. 4 is a Tauc plot for CdS films without and with extrinsic doping by the method shown in FIG. 3. The prepared CdS films were formed on bare glass and first transferred into the MOCVD chamber. The CdS film was then annealed at 170° C. under a $B_2H_6$ atmosphere for 10 min.

The Tauc plot of FIG. 4 can be used to determine the optical bandgap in amorphous thin film materials such as CdS or other buffer layer materials. Data corresponding to the undoped CdS film are indicated by circles 402, and data corresponding to the extrinsically doped CdS film are indicated by triangles 404. The plot shows the quantity hv (the optical energy of the light) on the abscissa. The quantity $(\alpha h v)^2$ (optical density) is plotted on the ordinate, where a is the absorption coefficient of the material.

Each of the Tauc plots in FIG. 4 has a linear region which denotes the onset of absorption. Extrapolating this linear region to the abscissa indicates the energy of the optical band gap of the material. The plot shows extrapolation lines 403 and 404 for the undoped film and for the extrinsically doped film 404, respectively. Thus, in the data plotted in FIG. 4, the optical bandgap energies are about 2.33 eV for the undoped CdS and 2.38 eV for the extrinsically doped CdS. From the plot of $(\alpha h v)^2$ vs. (hv), the shift of the band-gap toward higher energy is indicative of doping and suggests the incorporation of boron into the CdS films shown by the triangles 404. That is, the doping process can be performed by annealing in an atmosphere containing the desired dopant for modifying the carrier concentration and optical bandgap of buffer layers. The amount of bandgap increase can be controlled by controlling the doping level.

Figure 5:
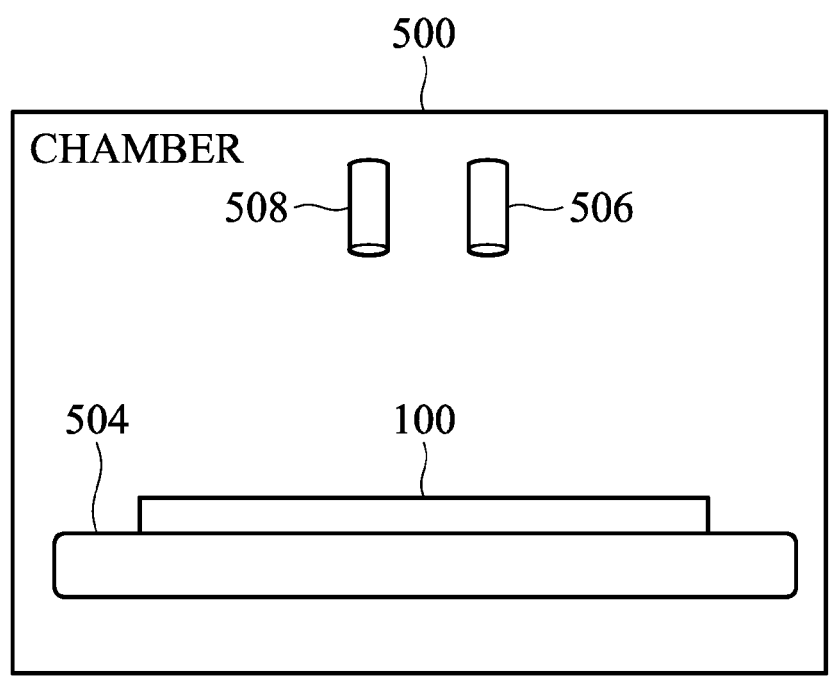
FIG. 5 is a schematic diagram of an MOCVD chamber for doping the buffer layer shown in FIG. 1.

FIG. 5 is a schematic diagram of an MOCVD chamber 500 for extrinsically doping the buffer layer 140 shown in FIG. 1. The solar cell substrate is provided on a staging surface, such as a platen or conveyor 504. In some embodiments, the chamber 500 has a plurality of nozzles for dispensing respective materials into the chamber. For example, FIG. 5 shows a first nozzle 506 for dispensing the doping material (e.g., $B_2H_6$) into the MOCVD chamber 500, and a second nozzle 508 for dispensing the TCO material (e.g., ITO) into the same MOCVD chamber 500 for forming the front contact layer 150. There is no need to break vacuum between the doping and front contact forming steps. In other embodiments (not shown), the conveyor 504 (or a robotic device) transports the solar cell 100 between different stations in the same tool for doping and applying TCO material, respectively.

By increasing the optical bandgap of the buffer layers, the efficiency of the solar array (for absorbing incoming light) can be increased. The short circuit current Jsc can be increased correspondingly. The increase in carrier concentration also increases the conductivity of the buffer layer 140. Thus, the overall series resistance of the solar cell can be reduced.

The methods described herein perform a separate extrinsic doping step on a buffer layer of solar cell, after depositing the buffer layer. In some embodiments, the extrinsic doping step anneals the buffer layer in an atmosphere containing the desired dopant. In some embodiments, the annealing is performed in the same MOCVD chamber used to perform subsequent TCO material deposition to form the front contact of the solar cell.

Increasing carrier concentration of the buffer layer 140 by extrinsic doping is beneficial for improving device performance of solar cells for a number of reasons. For example, the device resistance can be reduced by the enhanced conductivity of a doped buffer layer. Also, the increased carrier concentration of the doped buffer layer 140 contributes to the improvement in the open-circuit voltage Voc. Further, the interface recombination at the CdS/CIGS (buffer/absorber) interface can be reduced by increasing the carrier concentration of the buffer layer 140, improving the junction quality. Meanwhile, the increased optical bandgap of the CdS films can improve the photocurrent. The extrinsic doping process can be performed within the same MOCVD tool which is used for TCO preparation, so there is no extra equipment or facilities cost. Because a single tool is used for doping the buffer layer and depositing the front contact TCO material, there is no delay from breaking vacuum or transferring the substrate between the tool used for doping and the tool used for TCO deposition.

In some embodiments, a method comprises: forming a buffer layer over an absorber layer of a photovoltaic device; and extrinsically doping the buffer layer after the forming step.

In some embodiments, a method comprises: forming a buffer layer over an absorber layer of a photovoltaic device by a process from the group consisting of atomic layer deposition, sputtering, evaporation or chemical vapor deposition; and extrinsically doping the buffer layer.

In some embodiments, a method comprises: forming a buffer layer over an absorber layer of a photovoltaic device; annealing the buffer layer in a chamber having an atmosphere containing a dopant after the forming step; and forming a front contact layer on the buffer layer in the same chamber where the annealing is performed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a single buffer layer of a CdS material directly on an absorber layer of a photovoltaic device using a single non-chemical-bath-deposition process;
    extrinsically doping the single buffer layer in a chamber after the forming step, with a dopant having a concentration that varies between a top surface of the single buffer layer and an interface between the single buffer layer and the absorber layer; and
    forming a front contact layer of a second material directly on the single buffer layer in the same chamber, the CdS material extending from the interface between the buffer layer and the absorber layer to an interface between the buffer layer and the front contact layer, the second material having a different composition from the CdS material.

2. The method of claim 1, wherein the step of extrinsically doping the buffer layer includes annealing the buffer layer.

3. The method of claim 1, wherein the step of extrinsically doping the buffer layer includes annealing the buffer layer in an atmosphere comprising a dopant.

4. The method of claim 3, wherein the atmosphere comprises at least one of the group consisting of boron (B), aluminum (Al), gallium (Ga), indium (In), or combinations thereof.

5. The method of claim 3, wherein the atmosphere comprises $B_2H_6$.

6. The method of claim 3, wherein the annealing is performed at a temperature in a range from about 70° C. to about 400° C.

7. The method of claim 6, wherein the annealing is performed at about 170° C. for about 10 minutes.

8. The method of claim 1, wherein the step of forming the front contact layer comprises metal organic chemical vapor deposition.

9. A method comprising:
    forming a single buffer layer of a first CdS material directly on an absorber layer of a photovoltaic device by a non-chemical-bath-deposition (CBD) process from the group consisting of atomic layer deposition, sputtering, electro-deposition, evaporation or chemical vapor deposition;
    extrinsically doping the single buffer layer in a metal organic chemical vapor deposition (MOCVD) chamber; and
    forming a front contact layer of a second material directly on the single buffer layer in the same MOCVD chamber, the CdS material extending from an interface between the buffer layer and the absorber layer to an interface between the buffer layer and the front contact layer, the second material having a different composition from the CdS material.

10. The method of claim 9, wherein the step of extrinsically doping the buffer layer includes annealing the buffer layer.

11. The method of claim 9, wherein the step of extrinsically doping the buffer layer includes annealing the buffer layer in an atmosphere comprising a dopant.

12. The method of claim 11, wherein the atmosphere comprises $B_2H_6$.

13. The method of claim 12, wherein the annealing is performed at about 170° C. for about 10 minutes.

14. The method of claim 9 wherein the step of forming the front contact layer comprises metal organic chemical vapor deposition.

15. The method of claim 9, further comprising forming a front contact layer over the buffer layer, wherein:
    the steps of extrinsically doping the buffer layer and forming the front contact layer are both performed in a same chamber;
    the step of extrinsically doping the buffer layer includes annealing the buffer layer in an atmosphere comprising $B_2H_6$ at about 170° C. for about 10 minutes; and
    the step of forming the front contact layer comprises metal organic chemical vapor deposition.

16. The method of claim 15, further comprising:
    forming a back contact of molybdenum over a substrate comprising glass, plastic or a metal foil;
    forming the absorber over the back contact, where the absorber comprises at least one of the group consisting of copper (Cu), gallium (Ga), indium (In), aluminum (Al), selenium (Se), sulfur (S), or combinations thereof.

17. A method comprising:

forming a single buffer layer of CdS directly on an absorber layer of a photovoltaic device;

annealing the single buffer layer in a metal organic chemical vapor deposition (MOCVD) chamber having an atmosphere containing $B_2H_6$ after the forming step, so as to have a higher concentration of boron dopant at a top surface of the single buffer layer than at an interface between the single buffer layer and the absorber layer; and forming a front contact layer of a transparent conductive oxide directly on the single buffer layer in the same MOCVD chamber where the annealing is performed, so the CdS extends from the interface between the buffer layer and the absorber layer to an interface between the buffer layer and the front contact layer.

18. The method of claim 17, wherein:

the buffer layer is annealed at about 170° C. for about 10 minutes, and the step of forming the front contact layer comprises metal organic chemical vapor deposition.

19. The method of claim 1, wherein the doping increases the concentration in the single buffer layer at an interface between the single buffer layer and the absorber layer.

* * * * *

UNITED STATES PATENT AND TRADEMARK OFFICE
CERTIFICATE OF CORRECTION

PATENT NO.         : 9,520,530 B2                                           Page 1 of 1
APPLICATION NO.    : 14/505534
DATED              : December 13, 2016
INVENTOR(S)        : Jyh-Lih Wu It is certified that error appears in the above-identified patent and that said Letters Patent is hereby corrected as shown below:

In the Claims

Claim 9, Column 8, Line 24, remove "first" before "Cds".

Signed and Sealed this
Sixteenth Day of May, 2017

Michelle K. Lee
*Director of the United States Patent and Trademark Office*